(12) United States Patent
Wei et al.

(10) Patent No.: US 12,322,449 B2
(45) Date of Patent: Jun. 3, 2025

(54) MEMORY DEVICE, PROGRAMMING METHOD OF MEMORY DEVICE, AND MEMORY SYSTEM

(71) Applicant: Yangtze Memory Technologies Co., Ltd., Hubei (CN)

(72) Inventors: Jing Wei, Hubei (CN); Xiaojiang Guo, Hubei (CN)

(73) Assignee: YANGTZE MEMORY TECHNOLOGIES CO., LTD., Hubei (CN)

( * ) Notice: Subject to any disclaimer, the term of this patent is extended or adjusted under 35 U.S.C. 154(b) by 190 days.

(21) Appl. No.: 18/330,202

(22) Filed: Jun. 6, 2023

(65) Prior Publication Data

US 2024/0221839 A1    Jul. 4, 2024

Related U.S. Application Data

(60) Provisional application No. 63/477,936, filed on Dec. 30, 2022.

(30) Foreign Application Priority Data

May 18, 2023    (CN) .......................... 202310577096.7

(51) Int. Cl.
G11C 16/10    (2006.01)
G11C 16/08    (2006.01)
G11C 16/34    (2006.01)

(52) U.S. Cl.
CPC ............ *G11C 16/102* (2013.01); *G11C 16/08* (2013.01); *G11C 16/3459* (2013.01)

(58) Field of Classification Search
CPC ..................................................... G11C 16/14
See application file for complete search history.

(56) References Cited

U.S. PATENT DOCUMENTS

2019/0066797 A1*    2/2019    Yip .................... G11C 16/14

* cited by examiner

*Primary Examiner* — Jason Lappas
(74) *Attorney, Agent, or Firm* — Conley Rose, P.C.

(57) ABSTRACT

A method includes performing a programming operation on the memory cell using incremental step pulse programming. The programming operation includes applying one or more first voltage steps to the word line using a first step value to increase a threshold voltage of the memory cell toward a programming state. The programming operation also includes determining a quantity of memory cells that have a threshold voltage between first and second verification voltages. The second verification voltage is less than the first verification voltage and outside of a range of threshold voltages corresponding to the programming state. The programming operation also includes determining a step adjustment value based on the determining of the quantity. The programming operation also includes adjusting the first step value using the step adjustment value.

20 Claims, 11 Drawing Sheets

MEMORY DEVICE, PROGRAMMING METHOD OF MEMORY DEVICE, AND MEMORY SYSTEM

CROSS-REFERENCE TO RELATED APPLICATIONS

This application claims the benefit of U.S. Provisional Patent Application No. 63/477,936, filed on Dec. 30, 2022, which is incorporated by reference herein in its entirety.

TECHNICAL FIELD

The present disclosure generally relates to the field of semiconductor technology, and more particularly, to a method and devices for mitigating over-programming during a programming operation.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. The vertically stacked memory cells can form memory strings, where the channels of the memory cells are connected in each memory string. Each memory cell can be addressed through a word line and a bit line. Data (i.e., logic states) of the memory cells in an entire memory page sharing the same word line can be read or programmed simultaneously. However, due to aggressive scaling, reliability can be a concern for a 3D NAND flash memory.

BRIEF SUMMARY

Aspects of methods and mitigating over-programming during a programming operation are described in the present disclosure.

In some aspects, a programming method can be used for programming a memory device comprising memory cells and a word line coupled to a memory cell. The programming method can include performing a programming operation on the memory cell using incremental step pulse programming (ISPP). For example, the programming method can include applying one or more first voltage steps to the word line using a first step value to increase a threshold voltage of the memory cell toward a programming state. The method can also include determining a quantity of memory cells that have a threshold voltage between first and second verification voltages. The second verification voltage can be less than the first verification voltage and can be outside of a range of threshold voltages corresponding to the programming state. The method can also include determining a step adjustment value based on the determining of the quantity. The method can also include adjusting the first step value using the step adjustment value so as to mitigate over-programming.

In some aspects of the programming method, the programming method can include, before the determining of the quantity of memory cells that have a threshold voltage between first and second verification voltages, determining a quantity of memory cells that have a threshold voltage that is greater than the second verification voltage.

In some aspects of the programming method, the determining of the quantity of memory cells that have a threshold voltage that is greater than the second verification voltage can include determining whether a number of memory cells that have a threshold voltage that is greater than the second verification voltage is one or greater.

In some aspects of the programming method, the determining of the quantity of memory cells that have a threshold voltage between first and second verification voltages can include: determining a quantity of memory cells that have a threshold voltage that is equal to or greater than the first verification voltage; and determining a quantity of memory cells that have a threshold voltage that is equal to or greater than the second verification voltage.

In some aspects of the programming method, the determining of the quantity of memory cells that have a threshold voltage between first and second verification voltages comprises can also include determining a ratio of memory cells that have a threshold voltage between first and second verification voltages with respect to a statistical distribution of threshold voltages associated with the programming state.

In some aspects of the programming method, the determining of the quantity of memory cells that have a threshold voltage between first and second verification voltages can also include performing a dual-strobe sense operation with the first verification voltage being applied to the word line.

In some aspects of the programming method, the determining of the quantity of memory cells that have a threshold voltage between first and second verification voltages can include determining whether the quantity is in a first range or second range. A first step adjustment value can correspond to the first range and a second step adjustment value can correspond to the second range. The determining of the step adjustment value based on the determining of the quantity can include selecting the first or second step adjustment value based on the determining of whether the quantity is in the first range or second range.

In some aspects of the programming method, the first range can be less than the second range, and the first step adjustment value can be less than the second range.

In some aspects of the programming method, the programming method can also include applying a second voltage step to the word line based on the adjusting of the first step value to increase the threshold voltage of the memory cell.

In some aspects of the programming method, the applying of the second voltage step can use a second voltage step equal to a difference of the first step value and the step adjustment value.

In some aspects of the programming method, the step adjustment value can be less than the first step value.

In some aspects of the programming method, the programming operation can be a first-pass programming operation that uses at least the programming state as a first preliminary programming state and a second preliminary programming state greater than the first preliminary programming state. A second-pass programming operation can use at least a first target programming state and a second target programming state greater than the first target programming state. A first-pass range of voltages can be defined between a lower edge of the first preliminary programming state and an upper edge of the second preliminary programming state. The first and second target programming states can be within the first-pass range. The programming method can also include performing a second-pass programming operation on the memory cell to increase the threshold voltage of the memory cell up to the first target programming state or the second target programming state.

In some aspects, a memory device can be configured to mitigate over-programming during a programming operation. The memory device can include an array of memory cells, a word line coupled to a memory cell in the array of memory cells, and a peripheral circuit coupled to the array of memory cells through the word line. The peripheral circuit can be configured to perform operations. The operations can include applying one or more first voltage steps to the word line using a first step value to increase a threshold voltage of the memory cell toward a programming state. The operations can also include determining a quantity of memory cells that have a threshold voltage between first and second verification voltages. The second verification voltage can be less than the first verification voltage and can be outside of a range of threshold voltages corresponding to the programming state. The operations can also include determining a step adjustment value based on the determining of the quantity. The operations can also include adjusting the first step value using the step adjustment value.

In some aspects of the memory device, the operations can also include, before the determining of the quantity of memory cells that have a threshold voltage between first and second verification voltages, determining a quantity of memory cells that have a threshold voltage that is greater than the second verification voltage.

In some aspects of the memory device, the determining of the quantity of memory cells that have a threshold voltage that is greater than the second verification voltage can include determining whether a number of memory cells that have a threshold voltage that is greater than the second verification voltage is one or greater.

In some aspects of the memory device, the determining of the quantity of memory cells that have a threshold voltage between first and second verification voltages can include determining a quantity of memory cells that have a threshold voltage that is equal to or greater than the first verification voltage and determining a quantity of memory cells that have a threshold voltage that is equal to or greater than the second verification voltage.

In some aspects of the memory device, the determining of the quantity of memory cells that have a threshold voltage between first and second verification voltages can include determining a proportion of memory cells that have a threshold voltage between first and second verification voltages with respect to a statistical distribution of threshold voltages associated with the programming state.

In some aspects of the memory device, the determining of the quantity of memory cells that have a threshold voltage between first and second verification voltages can include performing a dual-strobe sense operation with the first verification voltage being applied to the word line.

In some aspects of the memory device, the determining of the quantity of memory cells that have a threshold voltage between first and second verification voltages can include determining whether the quantity is in a first range or second range. A first step adjustment value can correspond to the first range and a second step adjustment value can correspond to the second range. The determining of the step adjustment value based on the determining of the quantity can include selecting the first or second step adjustment value based on the determining of whether the quantity is in the first range or second range.

In some aspects of the memory device, the operations can also include applying a second voltage step to the word line based on the adjusting of the first step value to increase the threshold voltage of the memory cell.

In some aspects of the memory device, the applying of the second voltage step can use a second voltage step equal to a difference of the first step value and the step adjustment value.

In some aspects of the memory device, the operations can be multi-pass programming operations that include first-pass programming operation and a second-pass programming operation. The first-pass programming operation can use at least the programming state as a first preliminary programming state and a second preliminary programming state greater than the first preliminary programming state. The second-pass programming operation can use at least a first target programming state and a second target programming state greater than the first target programming state. A first-pass range of voltages can be defined between a lower edge of the first preliminary programming state and an upper edge of the second preliminary programming state. The first and second target programming states can be within the first-pass range. The operations can also include performing the second-pass programming operation on the memory cell to increase the threshold voltage of the memory cell up to the first target programming state or the second target programming state.

In some aspects, a storage system can be configured to mitigating over-programming during a programming operation. The storage system can include one or more memory devices and a memory controller coupled to the one or more memory devices. The memory controller can be configured to control the one or more memory devices. At least one of the one or more memory devices can include can include an array of memory cells, a word line coupled to a memory cell of the array of memory cells, and a peripheral circuit coupled to the array of memory cells through the word line. The peripheral circuit can be configured to perform operations. The operations can include applying one or more first voltage steps to the word line using a first step value to increase a threshold voltage of the memory cell toward a programming state. The operations can also include determining a quantity of memory cells that have a threshold voltage between first and second verification voltages. The second verification voltage can be less than the first verification voltage and can be outside of the range. The operations can also include determining a step adjustment value based on the determining of the quantity. The operations can also include adjusting the first step value using the step adjustment value.

In some aspects, a non-transitory computer readable device can have executable instructions for mitigating over-programming during a programming operation. The non-transitory computer-readable device can have instructions stored thereon that, when executed by a memory controller of a memory device, cause the peripheral circuit to perform operations. The memory device can include a memory cell configured to store two or more bits of data, a word line coupled to the memory cell, and a peripheral circuit coupled to the word line. The operations can include applying one or more first voltage steps to the word line using a first step value to increase a threshold voltage of the memory cell toward a programming state. The operations can also include determining a quantity of memory cells that have a threshold voltage between first and second verification voltages. The first verification voltage can be within a range of threshold voltages corresponding to the programming state. The second verification voltage can be less than the first verification voltage and can be outside of the range. The operations can also include determining a step adjustment value based on the determining of the quantity. The operations can also include adjusting the first step value using the step adjustment value.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
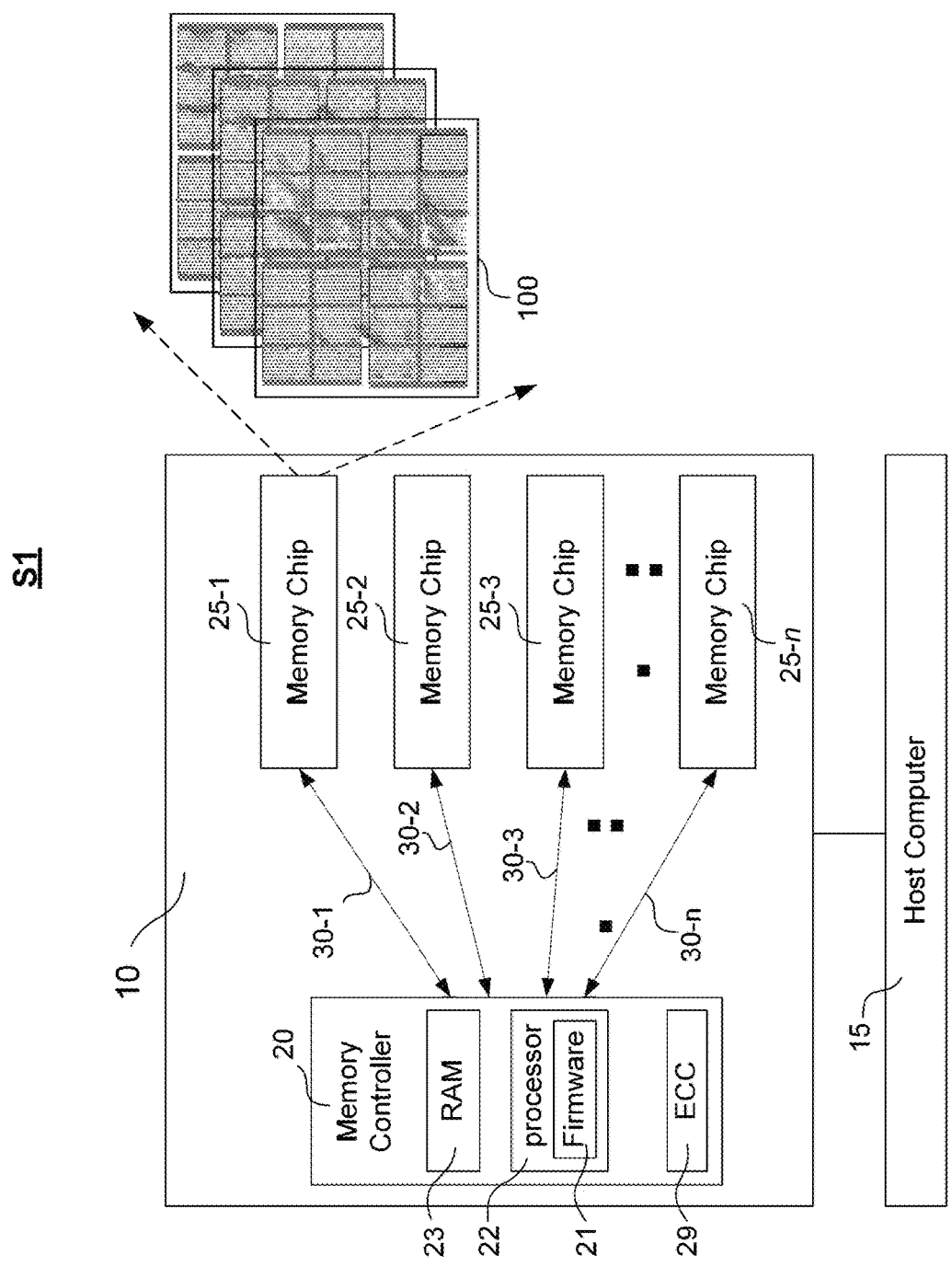
FIGS. 1 and 2A-2B illustrate a storage system with one or more memory chips, according to some aspects.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements.

Aspects of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one aspect," "an aspect," "an example aspect," "some aspects," etc., indicate that the aspect described can include a particular feature, structure, or characteristic, but every aspect may not necessarily include the particular feature, structure, or characteristic. Moreover, such phrases do not necessarily refer to the same aspect. Further, when a particular feature, structure or characteristic is described in connection with an aspect, it would be within the knowledge of a person skilled in the pertinent art to affect such feature, structure, or characteristic in connection with other aspects whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures, or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and can, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a block diagram of a system S1 having a storage system 10, according to some aspects. In some aspects, system S1 can be a mobile phone, a desktop computer, a laptop computer, a tablet, a vehicle computer, a gaming console, a printer, a positioning device, a wearable electronic device, a smart sensor, a virtual reality (VR) device, an augmented reality (AR) device, or any other suitable electronic devices having storage therein. Storage system 10 (e.g., a NAND storage system) can include a memory controller 20 and one or more semiconductor memory chips 25-1, 25-2, 25-3, . . . , 25-n. Each semiconductor memory chip 25 (hereafter just "memory chip") can be a NAND chip (e.g., "flash," "NAND flash" or "NAND"). Storage system 10 can communicate with a host 15 (e.g., a host computer) through memory controller 20, where memory controller 20 can be connected to one or more memory chips 25-1, 25-2, 25-3, . . . , 25-n, via one or more memory channels 30-1, 30-2, 30-3, . . . , 30-n. In some aspects, each memory chip 25 can be managed by memory controller 20 via one or more memory channels 30-1, 30-2, 30-3, . . . , 30-n.

In some aspects, host 15 can include a processor of an electronic device, such as a central processing unit (CPU), or a system-on-chip (SoC), such as an application processor (AP). Host 15 can send data to be stored at storage system 10 and/or can retrieve data from stored in storage system 10.

In some aspects, memory controller 20 can handle I/O requests received from host 15, ensure data integrity and efficient storage, and manage memory chip 25. To perform these tasks, memory controller 20 may run firmware 21, which can be executed by one or more processors 22 (e.g., micro-controller units, CPU) of memory controller 20. For example, memory controller 20 can run firmware 21 to map logical addresses (e.g., address utilized by the host associated with host data) to physical addresses in memory chip 25 (e.g., actual locations where the data is stored). Memory controller 20 also runs firmware 21 to manage defective memory blocks in the memory chip 25, where the firmware 21 can remap the logical address to a different physical address, i.e., move the data to a different physical address. The memory controller 20 can also include one or more memories 23 (e.g., DRAM, SRAM, EPROM, etc.), which can be used to store various metadata used by the firmware 21. In some aspects, the memory controller 20 can also perform error recovery through an error correction code (ECC) engine 29. ECC is used to detect and correct the raw bit errors that occur within each memory chip 25.

In some aspects, the memory channels 30 can provide data and control communication between the memory controller 20 and each memory chip 25 via a data bus. The memory controller 20 can select one of the memory chip 25 according to a chip enable signal.

In some aspects, each memory chip 25 in FIG. 1 can include one or more memory dies 100, where each memory die can be a 3D NAND memory.

Figure 2A:
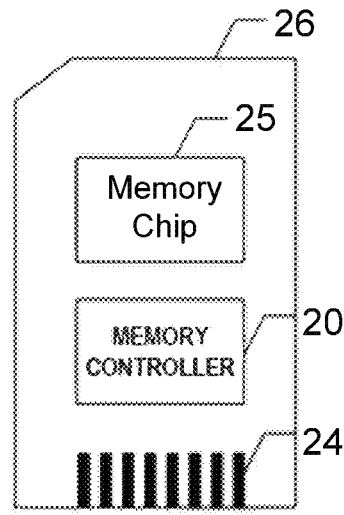
Figure 2B:
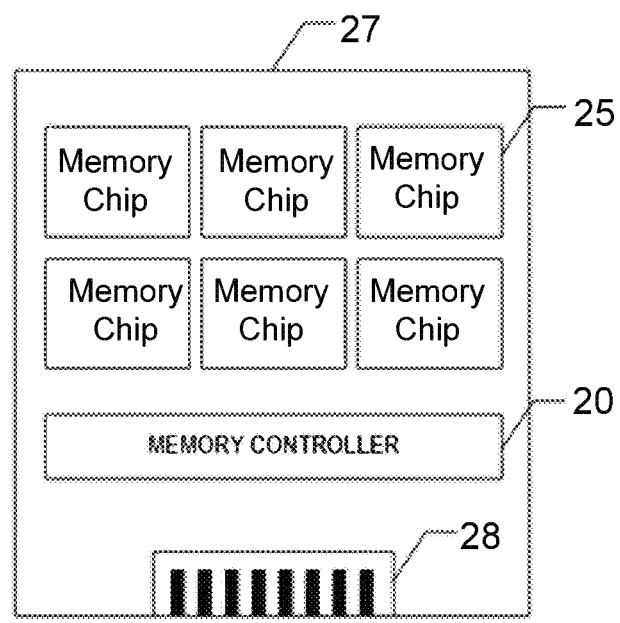

In some aspects, memory controller 20 and one or more memory chip 25 can be integrated into various types of storage devices, for example, be included in the same package, such as a universal Flash storage (UFS) package or an eMMC package. That is, storage system 10 can be implemented and packaged into different types of end electronic products. In one example as shown in FIG. 2A, memory controller 20 and a single memory chip 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., the host 15 in FIG. 1). In another example as shown in FIG. 2B, memory controller 20 and multiple memory chip 25 can be integrated into an solid state drive (SSD) 27. SSD 27 can further include an SSD connector 28 coupling SSD 27 with a host (e.g., the host 15 in FIG. 1).

Figure 3A:
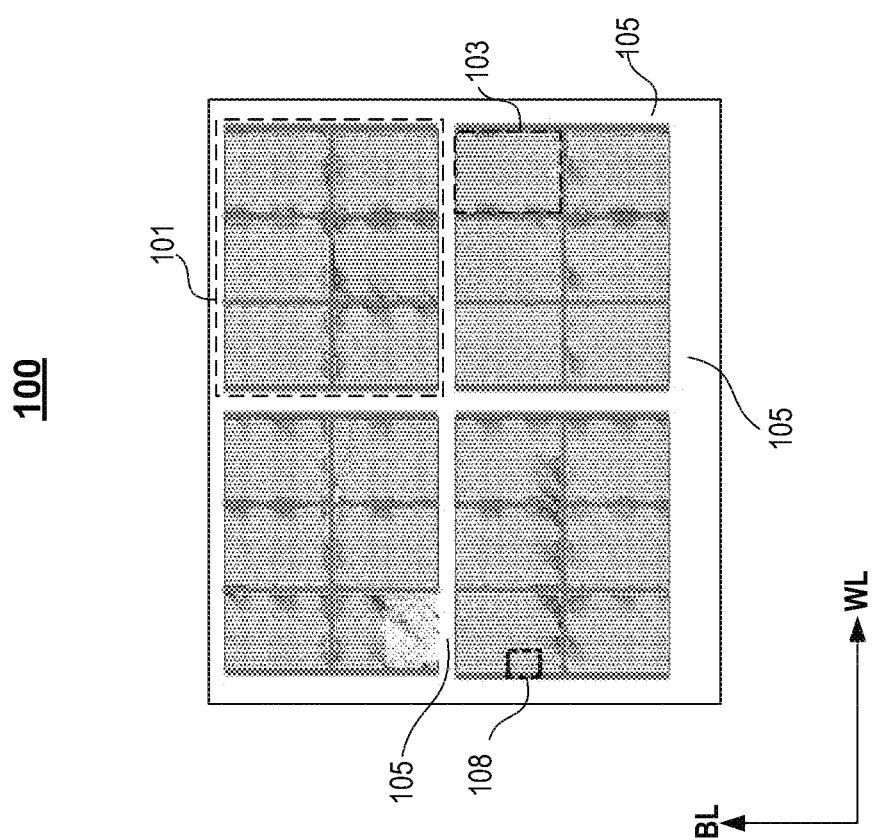
FIGS. 3A, 3B, and 4 illustrate schematic diagrams of a memory dies, according to some aspects.

FIG. 3A illustrates a top-down view of a memory die 100, according to some aspects. The example configuration shown in FIG. 3A is given as a non-limiting example and it is to be appreciated that memory is scalable. In some aspects, memory die 100 can include one or more memory planes 101, each of which can include a plurality of memory blocks 103. Identical and concurrent operations can take place at each memory plane 101. Memory block 103, which can be megabytes (MB) in size, is the smallest size to carry out erase operations. Memory die 100 can include, for example, four memory planes 101. Each memory plane 101 can include, for example, six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 3A.

In some aspects, memory die 100 can also include a peripheral region 105, an area surrounding memory planes 101. Each plane 101 can include a memory array and a peripheral region 105. The peripheral region 105 can include many digital, analog, and/or mixed-signal circuits to support functions of a memory array, for example, page buffers, row and column decoders and sense amplifiers. Peripheral circuits use active and/or passive semiconductor devices, such as transistors, diodes, capacitors, resistors, etc.

In some aspects, the arrangement of the memory planes 101 in the memory die 100 and the arrangement of the memory blocks 103 in each memory plane 101 illustrated in FIG. 3A are only used as an example, which does not limit the scope of the present disclosure.

Figure 3B:
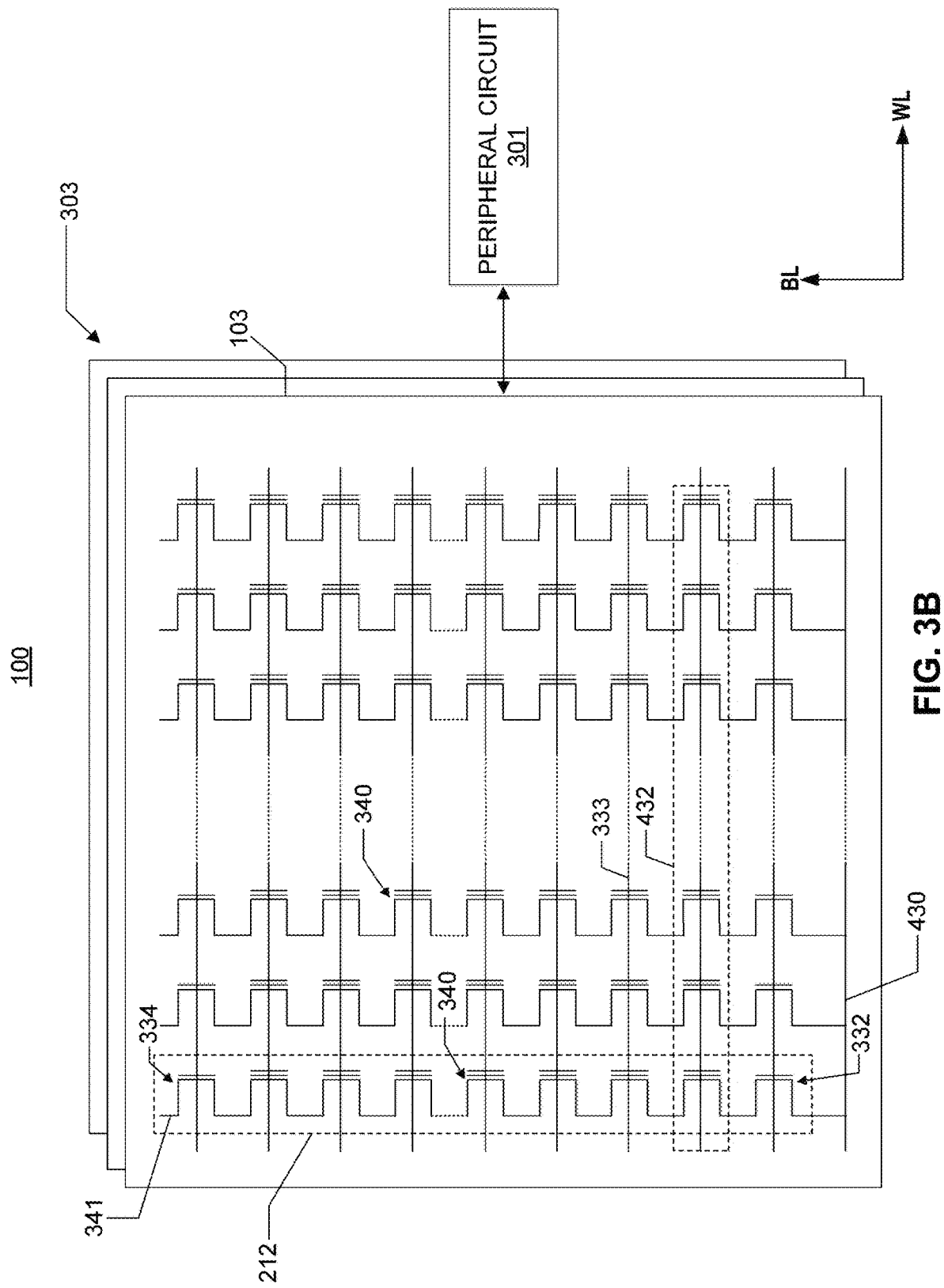
Figure 4:
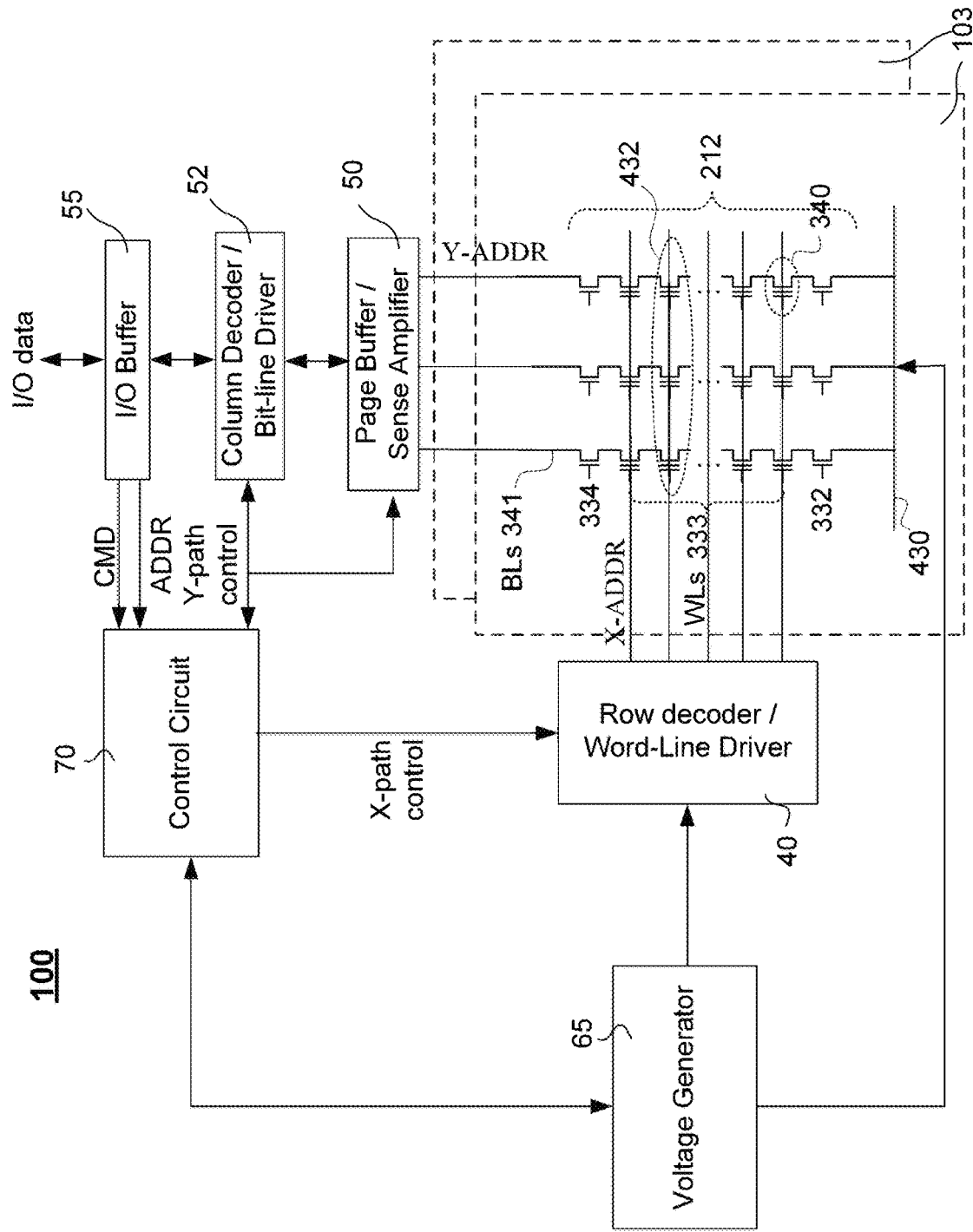

FIG. 3B illustrates an example schematic of a portion of memory die 100, according to some aspects. Memory die 100 can include memory block 103 and a peripheral circuit 301. Peripheral circuit 301 can include a page buffer (e.g., as shown in FIG. 4). Memory die 100 can include a plurality of memory cells 340 connected via bit lines 341 and word lines 333. Memory cells 340 can be organized as a memory cell array 303. Memory die 100 can also include a plurality of memory strings 212 and pages 432. Memory strings 212 can also include at least one field effect transistor (e.g., MOSFET) at each end, which is controlled by a lower select gate (LSG) 332 and a top select gate (TSG) 334, respectively. At least a portion of memory cells 340 sharing a same word line 333 form a memory page 432. At least a portion of memory cells 340 sharing a same bit line 341 form a memory string 212. Memory cells 340 can be controlled by a control gate, where the control gate can be connected to a word line 333 of the memory die 100. The drain terminal of TSG 334 can be connected to bit lines 341, and the source terminal of LSG 332 can be connected to source line(s) 430 (e.g., an array common source (ACS)). Source line(s) 430 can be shared by the memory strings in an entire memory block, and are also referred to as the common source line.

In some aspects, memory die 100 can be formed based on floating gate technology. Memory die 100 can be formed based on charge trapping technology. NAND flash memory based on charge trapping can provide high storage density and high intrinsic reliability. Storage data or logic states (e.g., threshold voltage Vth of memory cells 340) depend on the amount of charge trapped in a storage layer. Memory block 103 can be a three-dimensional (3D) memory device. Memory device 100 can be a 3D memory array with memory cells 340 vertically stacked on top of each other.

In some aspects, in a NAND memory, memory cells 340 can be in an erase state ER or a programmed state (e.g., programmed state P1, P2, P3, or the like). Initially, all memory cells 340 in can be reset to the erase state ER as logic "1" by implementing a negative voltage difference between control gates and source terminals of the memory cells (e.g., the source line(s) 430) such that trapped electronic charges in the storage layer of the memory cells 340 can be removed. For example, the negative voltage difference can be induced by setting the control gates of memory cells 340 to ground, and applying a high positive voltage to the array common source 430. At the erase state ER ("state ER"), the threshold voltage Vth of memory cells 340 can be reset to the lowest value, and can be measured or sensed at a corresponding one of bit lines 341.

In some aspects, during programming (e.g., writing data), a programming voltage Vpgm (e.g., a positive voltage pulse between 10 V and 20 V) can be applied on the control gate such that electronic charges (e.g., electrons) can be injected into the storage layer of a given memory cell 340, and thereby increase the threshold voltage Vth of the given memory cell 340. Thus the given memory cell 340 can be programmed to a programmed state (e.g., programmed state P1, P2, P3, or the like). As an example, memory cells 340 can be programmed to different states, such as P1-P15 in QLC mode.

FIG. 4 illustrates a schematic diagram of the memory die 100, according to some aspects. In some aspects, FIG. 4 shows a more detailed view of the interaction between memory die 100 and peripheral circuit 301. Memory die 100 can include one or more memory blocks 103 (e.g., 103-1, 103-2, 103-3). Each memory block 103 can include a plurality of memory strings 212. Each memory string 212 includes a plurality of memory cells 340. Memory cells 340 sharing the same word line forms a memory page 432. Memory string 212 can also include at least one field effect transistor (e.g., MOSFET) at each end, for example, a lower select transistor which is controlled by a lower select gate (LSG) 332 and a top select transistor which is controlled by a top select gate (TSG) 334. The drain terminal of the top select transistor can be connected to a bit line 341, and the source terminal of the lower select transistor can be connected to an array common source (ACS) 430. ACS 430 can be shared by the memory strings 212 in an entire memory block, and is also referred to as the common source line.

In some aspects, memory die 100 can also include a periphery circuit that can include many digital, analog, and/or mixed-signal circuits to support functions of the memory block 103, for example, a page buffer/sense amplifier 50, a row decoder/word line driver 40, a column decoder/bit line driver 52, a control circuit 70 (or control logic), a voltage generator 65 and an input/output buffer 55. These circuits can include active and/or passive semiconductor devices, such as transistors, diodes, capacitors, resistors, etc.

In some aspects, memory blocks 103 can be coupled with the row decoder/word line driver 40 via word lines ("WLs") 333, lower select gates ("LSGs") 332 and top select gates ("TSGs") 334. Memory blocks 103 can be coupled with page buffer/sense amplifier 50 via bit lines ("BLs") 341. Row decoder/word line driver 40 can select one of the memory blocks 103 on the memory die 100 in response to a X-path control signal provided by the control circuit 70. Row decoder/word line driver 40 can transfer voltages provided from the voltage generator 65 to the word lines according to the X-path control signal. During the read and program operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the control circuit 70.

In some aspects, column decoder/bit line driver 52 can transfer an inhibit voltage $V_{inhibit}$ to an unselected bit line and connect a selected bit line to ground according to a Y-path control signal received from control circuit 70. In the other words, column decoder/bit line driver 52 can be configured to select or unselect one or more memory strings 212 according to the Y-path control signal from control circuit 70. The page buffer/sense amplifier 50 can be configured to read and program (write) data from and to the memory block 103 according to the control signal Y-path control from the control circuit 70. For example, the page buffer/sense amplifier 50 can store one page of data to be programmed into one memory page 432. In another example, page buffer/sense amplifier 50 can perform verify operations to ensure that the data has been properly programmed into each memory cell 340. In yet another example, during a read operation, page buffer/sense amplifier 50 can sense current flowing through the bit line 341 that reflects the logic state (i.e., data) of the memory cell 340 and amplify small signal to a measurable magnification.

In some aspects, input/output buffer 55 can transfer the I/O data from/to the page buffer/sense amplifier 50 as well as addresses ADDR or commands CMD to the control circuit 70. In some aspects, input/output buffer 55 can function as an interface between memory controller 20 (in FIG. 1) and memory die 100 on memory chip 25.

In some aspects, control circuit 70 can control page buffer/sense amplifier 50 and row decoder/word line driver 40 in response to the commands CMD transferred by the input/output buffer 55. During the program operation, control circuit 70 can control row decoder/word line driver 40 and page buffer/sense amplifier 50 to program a selected memory cell. During the read operation, control circuit 70 can control row decoder/word line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify memory page 432, memory block 103, and memory plane 101 (in FIG. 3), respectively. The column address Y-ADDR can identify a byte or a word in the data of the memory page 432.

In some aspects, voltage generator 65 can generate voltages to be supplied to word lines and bit lines under the control of control circuit 70. The voltages generated by voltage generator 65 include the read voltage $V_{read}$, the program voltage $V_{pgm}$, the pass voltage $V_{pass}$, the inhibit voltage $V_{inhibit}$, etc.

It is noted that the arrangement of the electronic components in the storage system 10 and the memory die 100 in FIGS. 1, 2A-2B, and 3-4 are shown as non-limiting examples. In some aspects, storage system 10 and memory die 100 can have other layout and can include additional components. Components (e.g., control circuit 70, I/O buffer 55) on memory die 100 shown in FIG. 4 can also be moved off memory die 100, as a stand-alone electric component in the storage system 10. Components (e.g., control circuit 70, I/O buffer 55) on memory die 100 shown in FIG. 4 can also be moved to other components in storage system 10, for example, a portion of control circuit 70 can be combined with memory controller 20 and vice versa.

In some aspects, control circuit 70 can be coupled to registers (e.g., status registers, command registers, address registers, or the like, for storing status information, command operation codes, command addresses for controlling operations of peripheral circuits, or the like). Control circuit 70, registers, and/or firmware 21 (FIG. 1) can be considered non-transitory computer-readable devices for storing instructions that, when executed by one or more controllers and/or processors, allow peripheral circuits to perform operations disclosed herein.

In some aspects, in a NAND flash memory, a read operation and a write operation (also referred to as program operation) can be performed for the memory page 432, and an erase operation can be performed for the memory block 103.

In some aspects, in a NAND memory, the memory cell 340 can be in an erased state ER or a programmed state P1. Initially, memory cells 340 in memory block 103 can be reset to the erased state ER as logic "1" by implementing a negative voltage difference between control gates and channels such that trapped charge carriers in the memory film of memory cells 340 can be removed. For example, the negative voltage difference can be induced by setting control gates of memory cells 340 to ground and applying a high positive voltage (an erase voltage $V_{erase}$) to source line(s) 430. At the erased state ER ("state ER"), the threshold voltage $V_{th}$ of memory cells 340 can be reset to the lowest value.

In some aspects, during programming (e.g., writing), a positive voltage difference between control gates and channels can be established by, for example, applying a program voltage $V_{pgm}$ (e.g., a positive voltage pulse between 10 V and 20 V) on a control gate and grounding the corresponding bit line 341. As a result, charge carriers (e.g., electrons) can be injected into the memory film of memory cell 340, thereby increasing the threshold voltage $V_{th}$ of memory cell 340. Accordingly, memory cell 340 can be programmed to the programmed state P1 ("state P1" or logic "0").

In some aspects, the state of the memory cell (e.g., state ER or state P1) can be determined by measuring or sensing the threshold voltage $V_{th}$ of the memory cell. During a read operation, a read voltage $V_{read}$ can be applied on the control gate of the memory cell and current flowing through the memory cell can be measured at bit line 341. A pass voltage $V_{pass}$ can be applied on unselected word lines to switch on unselected memory cells.

In some aspects, a NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states ("states"), logic {1 and 0}, i.e., states ER and P1. In the MLC mode, a memory cell stores 2 bits, and has four logic states, logic {11, 10, 01, and 00}, i.e., states ER, P1, P2, and P3. In the TLC mode, a memory cell stores 3 bits, and has eight logic states, logic {111, 110, 101, 100, 011, 010, 001, 000}, i.e., states ER, and states P1-P7. In the QLC mode, a memory cell stores 4 bits and has 16 logic states. Memory controller 20 of storage system 10 (see FIG. 1) can convert data received from host 15 into corresponding logic states of the memory cells on memory dies 100 and vice versa.

Figure 5:
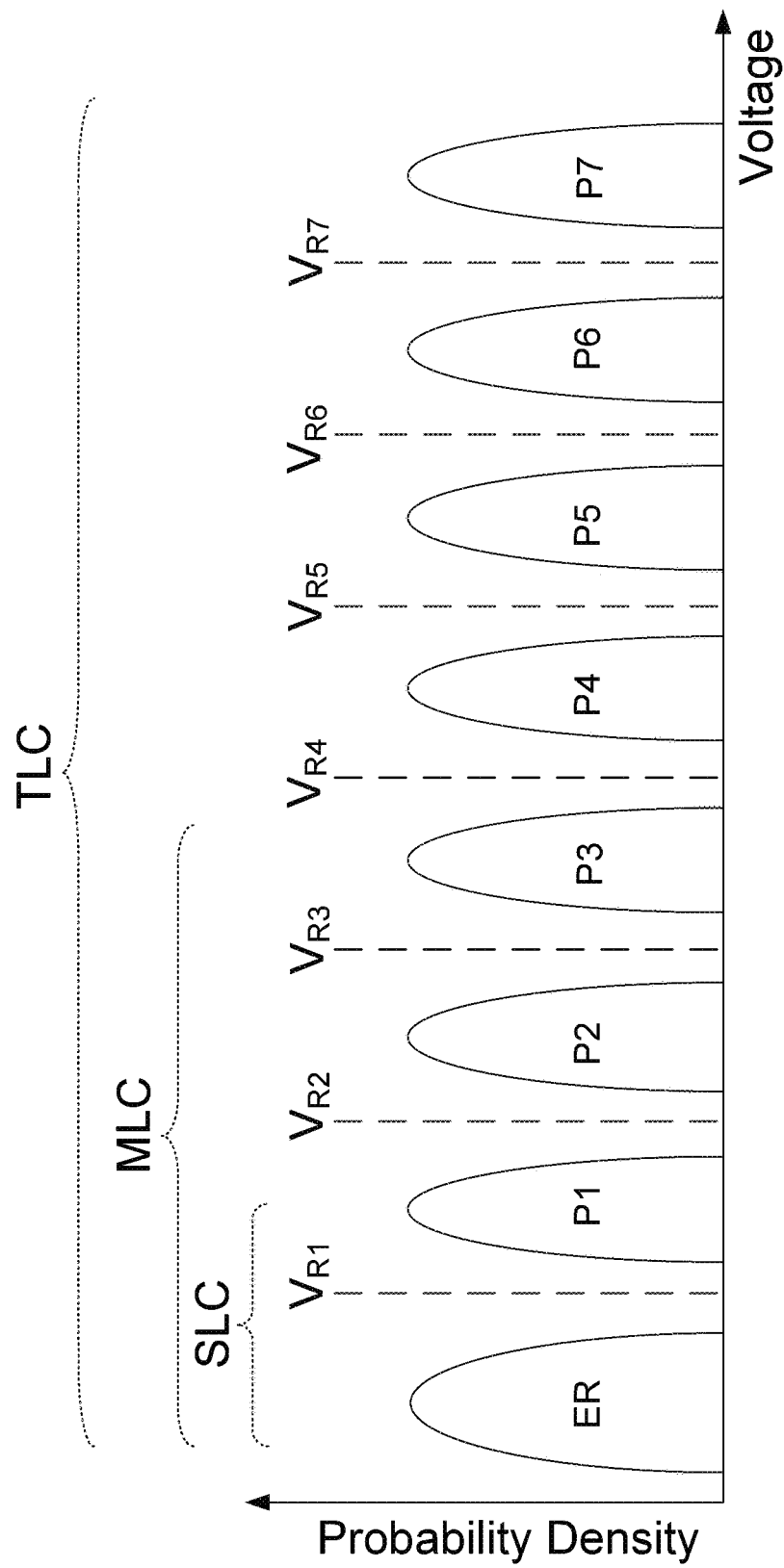
FIGS. 5, 6, and 7 illustrate threshold voltage $V_{th}$ distributions of a NAND flash memory, according to some aspects.

FIG. 5 illustrates a threshold voltage $V_{th}$ distribution of a NAND flash memory programmed in a triple-level cell (TLC) mode, according to some aspects. In some aspects, each state of the memory cells can correspond to a specific range of threshold voltage $V_{th}$, where the threshold voltage $V_{th}$ distribution of each state can be represented by a probability density. In some aspects, the eight TLC states can be programmed by using an incremental step pulse programming (ISPP) scheme where the programming voltage $V_{pgm}$ can be incrementally increased by adding a step pulse $V_{step}$. Accordingly, the eight TLC states can be programmed from the state P1 with a lower threshold voltage to the state P7 with a highest threshold voltage.

In some aspects, after programming, the eight TLC states ER and P1-P7 can be verified by using one or more read reference voltages $V_{R1}$-$V_{R7}$ during a verification process. By applying one or more of the read reference voltages $V_{R1}$-$V_{R7}$ to the control gate of a target memory cell, the range of the memory cell's threshold voltage $V_{th}$ can be determined. For example, to verify if a memory cell is at state ER, the read reference voltage $V_{R1}$ can be used. If the target memory cell is at state ER, the threshold voltage $V_{th}$ of the target memory cell is lower than the read reference voltage $V_{R1}$. The target memory cell can be switch on and form a conductive path in the channel. If the target memory cell is at any one of the states P1-P7, the threshold voltage $V_{th}$ of the target memory cell is higher than the read reference voltage $V_{R1}$. The target memory cell is thereby switched off. By measuring or sensing the current through the target memory cell at the corresponding bit line, via the page buffer/sense amplifier 50, the threshold voltage $V_{th}$ or the state of the target memory cell can be verified.

In some aspects, as described above, to determine the two states ER and P1 stored in the SLC mode, it is sufficient to rely on just the read reference voltage $V_{R1}$. To determine the four states ER and P1-P3 in the MLC mode, the read reference voltages $V_{R1}$, $V_{R2}$ and $V_{R3}$ can be used. To determine the eight states ER and P1-P7 for the TLC mode, the read reference voltages $V_{R1}$-$V_{R7}$ can be used. For example, in the TLC mode, the threshold voltage of state ER is below $V_{R1}$, and the threshold voltage of state P7 is above $V_{R7}$, where the threshold voltages of state P1 is between $V_{R1}$ and $V_{R2}$. States P2-P6 can be determined similarly.

Figure 6:
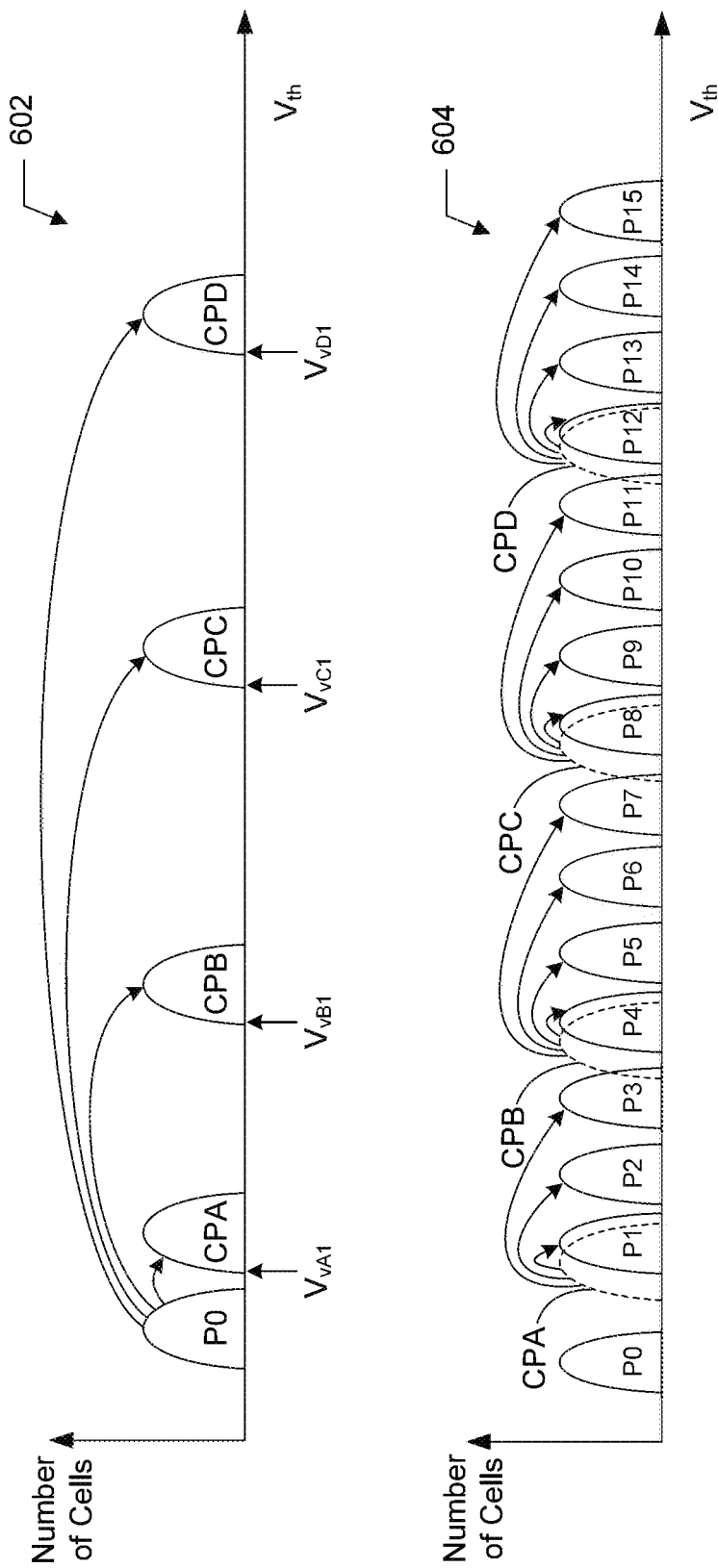

FIG. 6 illustrates a threshold voltage $V_{th}$ distribution of a NAND flash memory programmed in a quad-level cell (QLC) mode, according to some aspects. In some aspects, the sixteen QLC states (e.g., ER and P1-P15) can be programmed by using an incremental step pulse programming (ISPP) scheme similar to the processes described in reference to FIG. 5. Programming verification can also be performed as described above.

In some aspects, a multi-pass programming scheme can be used for faster and more accurate programming. In one example, a multi-pass programming scheme can comprise at least a first-pass programming scheme 602 and a second-pass programming scheme 604 (illustrated using threshold voltage distributions). First-pass programming can be characterized by having fewer coarse programming states (e.g., CPA, CPB, CPC, CPD, or the like) compared to the sixteen finer target states (ER and P1-P15). While the sixteen target states have corresponding verification voltages as described above, the coarse programming states CPA, CPB, CPC, and CPD also have corresponding verification voltages (e.g., $V_{vA1}$, $V_{vB1}$, $V_{vC1}$, and $V_{vD1}$). The verification voltages allow a memory device to determine whether a programming operation has succeeded in raising a memory cell to a given programming state.

In some aspects, enumerative adjectives (e.g., "first," "second," "third," or the like) can be used to distinguishing like elements without establishing an order, hierarchy, quantity, or permanent numeric assignment (unless otherwise noted). For example, the terms "first programming state" and "second programming state" can be used in a manner analogous to "$i^{th}$ programming state" and "$j^{th}$ programming state" so as to facilitate the distinguishing of two programming states without specifying a particular order, hierarchy, quantity, or immutable numeric correspondence.

In some aspects, programming states can be characterized by having approximately a bell curve distribution with a lower bound and an upper bound (or lower edge and upper edge).

First-pass programming scheme 602 can also be described using qualifiers such as "intermediate", "preliminary", "coarse", or the like to describe the large gaps between preliminary programming states CPA, CPB, CPC, and CPD. To program a memory cell to, for example, programming state P15, a first-pass programming operation can comprise large/coarse increments of voltage pulses (large $V_{step}$) applied to a word line so as to promote the memory cell to preliminary programming state CPD. In order to ensure that the programming operation does not overshoot the intended state CPD, the ISPP is accompanied with verification operations, which check to see if the programming operation has reached the verification voltage $V_{vD1}$.

Then, in some aspects, a second pass programming operation can be performed on the memory cell, which comprises small/fine increments of voltage pulses (small $V_{step}$) applied to the word line so as to promote the memory cell to target programming state P15. Second-pass programming scheme 604 can also be described using qualifiers such as "final", "target", "fine", or the like to describe the fine adjustments of threshold voltage of a memory cell to a final or target state.

In some aspects, to preliminary programming states CPA and CPB can define a first-pass range (non-limiting example). The first-pass range can be defined by the smallest value of preliminary programming state CPA (lower boundary or edge) and the highest value for preliminary programming state CPB (upper boundary or edge). Target programming states P1, P2, and P3 are within the defined first-pass range. When performing the second-pass programming operation, the preliminary programming state CPA can be an intermediate state that facilitates the final programming of the intended target state within the range. Other first-pass ranges are defined between preliminary programming states CPB and CPC, between preliminary programming states CPC and CPD, or the like.

In some aspects, using an incremental step pulse programming (ISPP) scheme has a risk of overshooting the intended programming state. This overshooting phenomenon can be referred to as "over-programming". The systems and methods disclosed herein can be used to mitigate problems of over-programming. The systems and methods disclosed herein can be applied to single-pass programming as well as multi-pass programming.

Figure 7:
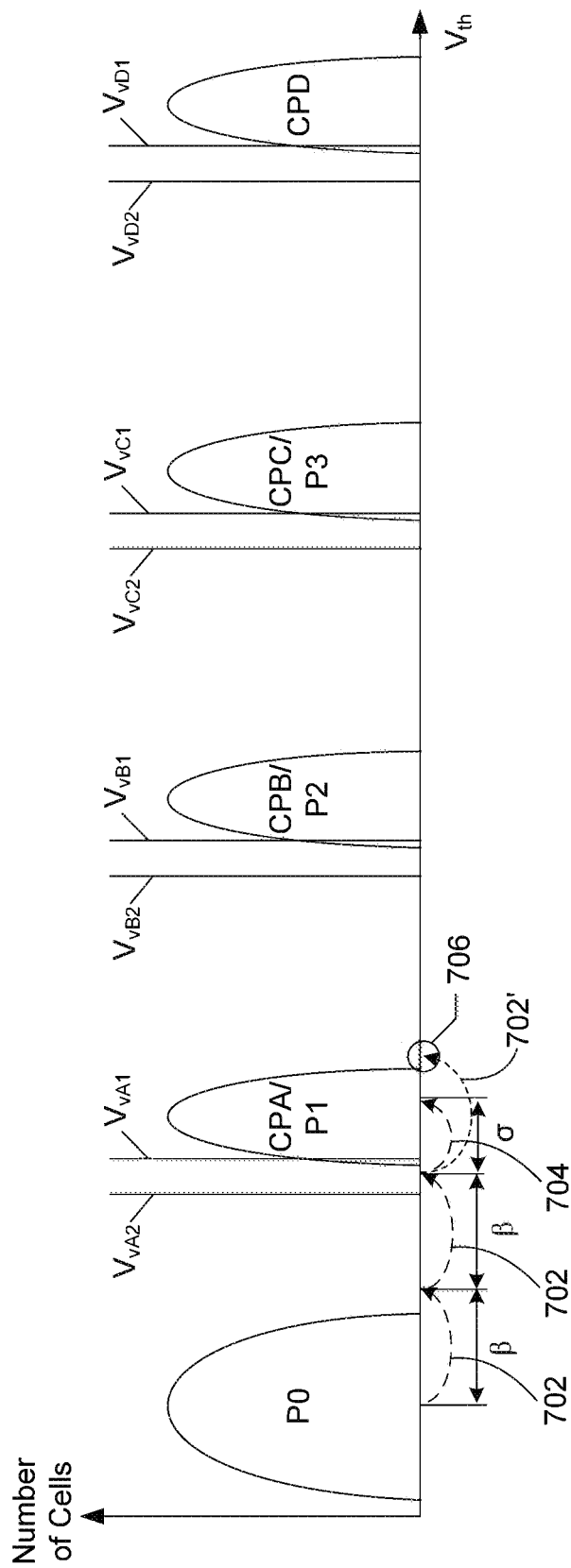

FIG. 7 illustrates a threshold voltage $V_{th}$ distribution of a NAND flash memory programmed in a multi-pass scheme for quad-level cell (QLC) mode or a single-pass scheme for a multi-level cell (MLC), according to some aspects. When considering a multi-pass scheme, states P0, CPA, CPB, CPC, and CPD can be as described in reference to FIGS. 5 and/or 6 (e.g., preliminary programming states). When considering a single-pass scheme, the bell curve distribution of state CPA can instead be thought of as programming state P1. A similar analogy can also follow for CPB/P2, CPC/P3, and so on.

In some aspects, while the layout of FIG. 7 is a graphed distribution of threshold voltages for the memory cells of a memory device (e.g., memory device 100 (FIGS. 1, 3A, 3B, 4)), non-graph elements, such as incremental voltage steps, have been overlaid on top of the graph in order correlate discussions of applied voltages to a resulting threshold voltage of a memory cell.

In some aspects, a memory device is to perform a programming operation so as to raise a memory cell from an erased state P0 to programming state CPA. In this non-limiting example, the intended state is programming state CPA. However, those skilled in the art will appreciate that the process can be extrapolated to higher programming states CPB, CPC, CPD, or the like. The programming of the memory cell can comprise applying one or more voltage steps 702 (e.g., first voltage steps) to the word line of the memory cell. This increases a programming state of the memory cell toward programming state CPA. Voltage steps 702 can have a voltage step value β (e.g., first step value).

In some aspects, FIG. 7 illustrates a non-limiting example in which the memory cell being programmed has not reached programming state CPA after an integer number of voltage steps 702 (e.g., verifiable using verification voltage $V_{vA1}$). An additional voltage step 702' (with voltage step value β) has the risk of causing over-programming 706 to the memory cell. That is, the threshold voltage of the memory cell can reach beyond the prescribed range of threshold voltages that correspond to programming state CPA. To mitigate the risk, a next voltage step 704 can be performed, which implements an adjustment to voltage step value β (e.g., decreasing β).

In some aspects, to implement the adjustment for voltage step value β, the memory device can be programmed to implement an additional set of verification voltages. Shown in FIG. 7, the coarse programming states CPA, CPB, CPC, and CPD can have corresponding additional verification voltages (e.g., $V_{vA2}$, $V_{vB2}$, $V_{vC2}$, and $V_{vD2}$). Using programming state CPA as an example, first verification voltage $V_{vA1}$ can be within a range of threshold voltages corresponding to programming state CPA. First verification voltage $V_{vA1}$ can be proximal to a lower bound of the range of threshold voltages corresponding to programming state CPA. Second verification voltage $V_{vA2}$ can be less than and lie outside of the range of threshold voltages corresponding to programming state CPA. An analogous relationship can be inferred for the sets CPB/$V_{vB1}$/$V_{vB2}$, CPC/$V_{vC1}$/$V_{vC2}$, and CPD/$V_{vD1}$/$V_{vD2}$.

Referring back to CPA, $V_{vA1}$, and $V_{vA2}$, in some aspects, the region of interest is the range between the first verification voltage $V_{vA1}$ and the second verification voltage $V_{vA2}$. To determine a suitable adjustment for voltage step value β, a check can be performed. For example, the memory device can determine a quantity of memory cells of the memory device that have a threshold voltage between first and second verification voltages $V_{vA1}$ and $V_{vA2}$. The quantity can be expressed in a number of alternative ways. For example, the quantity can be an integer number of memory cells, a ratio or proportion of memory cells with respect to a larger collective (e.g., X percent of memory cells in a memory block), or the like. A step adjustment value δ can be determined based on the quantity of memory cells that have a threshold voltage between first and second verification voltages $V_{vA1}$ and $V_{vA2}$. Voltage step value β can be adjusted based on the determined step adjustment value δ. For example a second voltage step value σ can be calculated as a difference between voltage step value β and step adjustment value δ (e.g., σ=β−δ). Then, instead of performing additional voltage step 702' (with voltage step value β), a second voltage step 704 is performed (with voltage step value), thereby arriving within the boundaries of programming state CPA while avoiding over-programming 706.

In some aspects, there can be a number of ways to determine the quantity of memory cells that have a threshold voltage between first and second verification voltages $V_{vA1}$ and $V_{vA2}$. As an example, the memory device can determine and keep a running record of a quantity of memory cells whose threshold voltage is greater than or equal to the second verification voltages $V_{vA2}$. This can be performed prior to the step of determining the quantity of memory cells of the memory device that have a threshold voltage between first and second verification voltages $V_{vA1}$ and $V_{vA2}$. The memory device can also be programmed with a condition (e.g., determine whether a number of memory cells that have a threshold voltage that is greater than the second verification voltage $V_{vA2}$ is one or greater). Then, when it is time to determine the quantity of memory cells of the memory device that have a threshold voltage between first and second verification voltages $V_{vA1}$ and $V_{vA2}$, it is enough to determine a quantity of memory cells that have a threshold voltage that is equal to or greater than the first verification voltage $V_{vA1}$. For example, the quantity of memory cells of the memory device that have a threshold voltage between first and second verification voltages $V_{vA1}$ and $V_{vA2}$ can be determined based on the determined quantity of memory cells whose threshold voltage is greater than or equal to the second verification voltages $V_{vA2}$ and the determined quantity of memory cells that have a threshold voltage that is equal to or greater than the first verification voltage $V_{vA1}$).

In some aspects, a dual-strobe sense operation can be used to determine the quantity of memory cells that have a threshold voltage between first and second verification voltages $V_{vA1}$ and $V_{vA2}$.

In some aspects, the determined quantity of memory cells that have a threshold voltage between first and second verification voltages $V_{vA1}$ and $V_{vA2}$ can be few or many. For example, the greater the quantity of memory cells that have a threshold voltage between first and second verification voltages $V_{vA1}$ and $V_{vA2}$, the larger the step adjustment value δ. Table 1 shows a non-limiting example of a relationship between an integer number X of memory cells that have a threshold voltage between first and second verification voltages $V_{vA1}$ and $V_{vA2}$ and a step adjustment value δ. In table 1, $X_1 < X_2 < X_3$ and $δ_1 < δ_2 < δ_3$. Other relationships are also envisaged (e.g., coarser or finer divisions of step adjustment value δ, X expressed as a ratio, or the like).

TABLE 1

| If $1 ≤ X < X_1$ | Then $δ = δ_1$ |
| If $X_1 ≤ X < X_2$ | Then $δ = δ_2$ |
| If $X_2 ≤ X < X_3$ | Then $δ = δ_3$ |

In some aspects, for a given programming state (e.g., CPA), the programming methods disclosed herein can be used to adjust voltage step value β multiple times until the given programming state is successfully programmed.

In some aspects, adjustments to voltage step value β can be saved for future use. For example, prior adjustments to voltage step value β (and the resulting success in programming memory cells) can be relied upon in order to optimize subsequent programming operations. For example, a condition was described above in which the memory device can determine whether a number of memory cells that have a threshold voltage that is greater than the second verification voltage $V_{vA2}$ is one or greater. However, based on the success of prior adjustments to voltage step value β, a suitable first voltage step value β can be selected for a programming operation before the memory device even determines whether a number of memory cells that have a threshold voltage that is greater than the second verification voltage $V_{vA2}$ is one or greater.

In some aspects, starting voltage or initial programming voltage of the second-pass programming operation can be based on the last programming voltage of the first-pass programming operation. The adjustments to voltage step value β described above can be used in multi-pass and single-pass programming operations. Peripheral circuit 301 (FIG. 3B) can be configured to perform the operations for adjusting voltage step value β described above. Instructions for operating peripheral circuit 301 (FIG. 3B) to perform the functions disclosed herein can be stored on memory device 100 and/or storage system 10 (e.g., in firmware 21 (FIG. 1), control logic 70 (FIG. 4), or the like).

Figure 8:
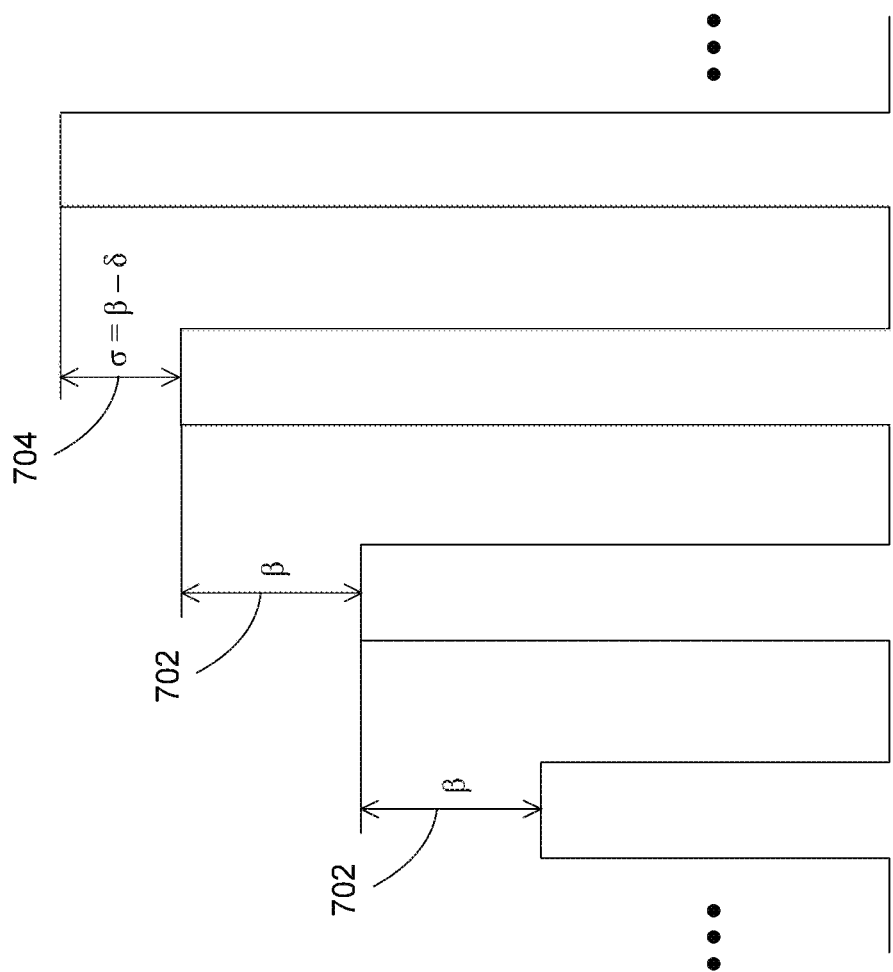
FIG. 8 illustrates step increases of programming pulses used in a programming operation, according to some aspects.

FIG. 8 illustrates step increases of programming pulses used in a programming operation, according to some aspects. In some aspects, the programming voltage waveform can comprise one or more voltage steps 702 (e.g., first voltage steps) followed by a voltage step 704 (e.g., second voltage step). One or more voltage steps 702 can have a voltage step value β. Voltage step 704 can have a voltage step value σ=β−δ.

Figure 9:
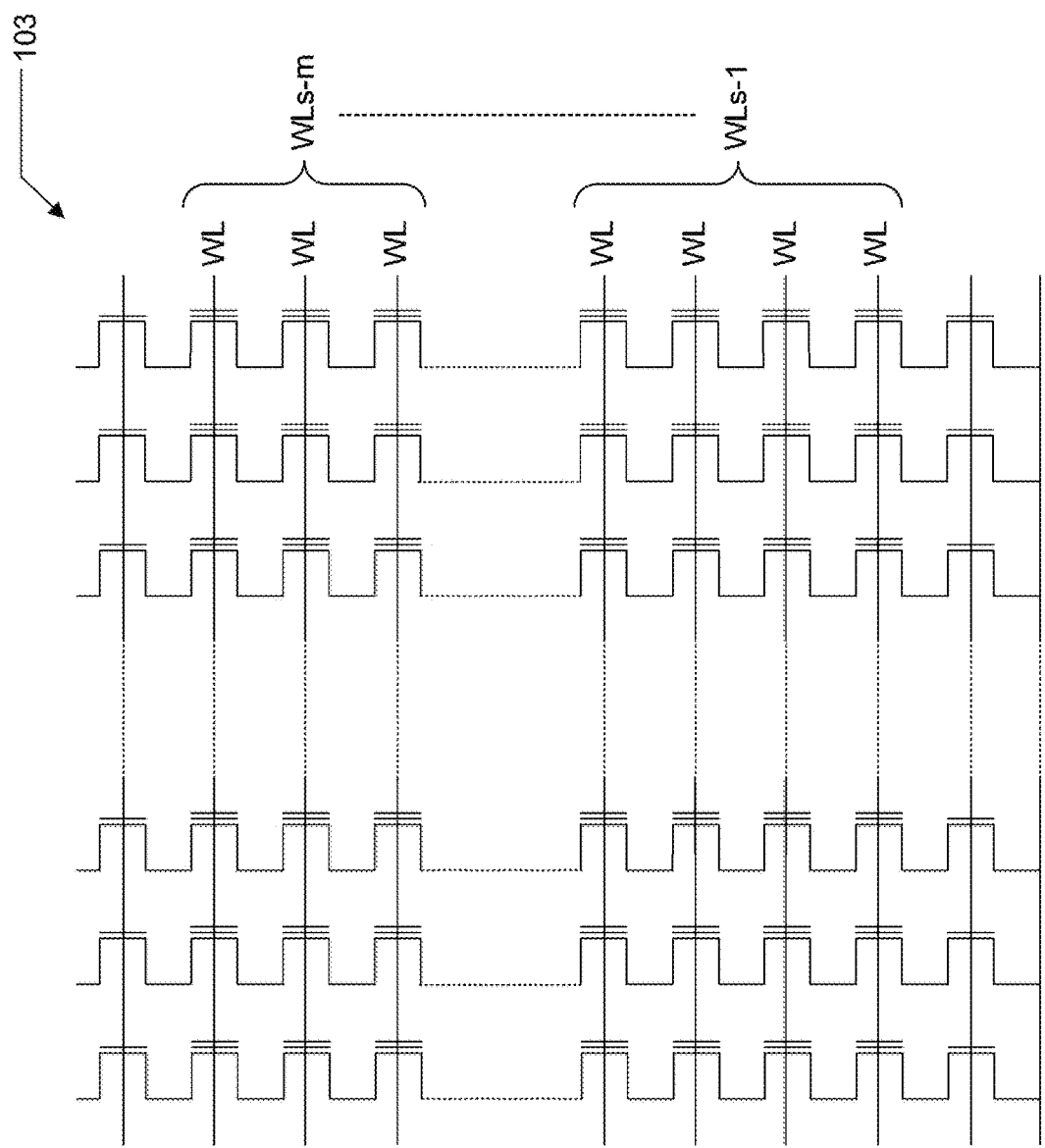
FIG. 9 illustrates section arrangements for a given memory block 103, according to some aspects.

FIG. 9 illustrates section arrangements for a given memory block 103, according to some aspects. In some aspects, when performing a programming operation at a given memory cell(s) at a given word line WL, memory device 100 (FIGS. 1, 3A, 3B, 4) can determine, for the given memory block 103, a quantity of memory cells that have a threshold voltage between first and second verification voltages $V_{vA1}$ and $V_{vA2}$. The resulting adjustment to voltage step value β can then be used for subsequent programming operations within the given memory block 103. The adjustment information can be stored as dynamic start voltage (DSV) information. The DSV information can be used as a reference when performing programming operations on memory cells coupled to other word lines WL. In this manner, operation times can be reduced by not needing to perform the voltage step value adjustment for every memory cell.

In some aspects, the word lines WL can be grouped into sections. Shown in FIG. 9 are word lines grouped as WLs–1 to WLs–m, with the index "m" indicating an $m^{th}$ section. In some aspects, instead of confining the voltage step value adjustment method to the whole of the given memory block 103, the voltage step value adjustment method can be more finely tuned so as to act on sections of word lines. When performing a programming operation at a given memory cell(s) at a given word line WL in a section (e.g., WLs–1), memory device 100 (FIGS. 1, 3A, 3B, 4) can determine, for the section, a quantity of memory cells that have a threshold voltage between first and second verification voltages $V_{vA1}$ and $V_{vA2}$. The resulting adjustment to voltage step value β can then be used for subsequent programming operations within the section. The adjustment information can be stored as dynamic start voltage (DSV) information. The DSV information can be used as a reference when performing programming operations on memory cells coupled to other word lines WL. In this manner, operation times can be reduced by not needing to perform the voltage step value adjustment for every memory cell.

Figure 10:
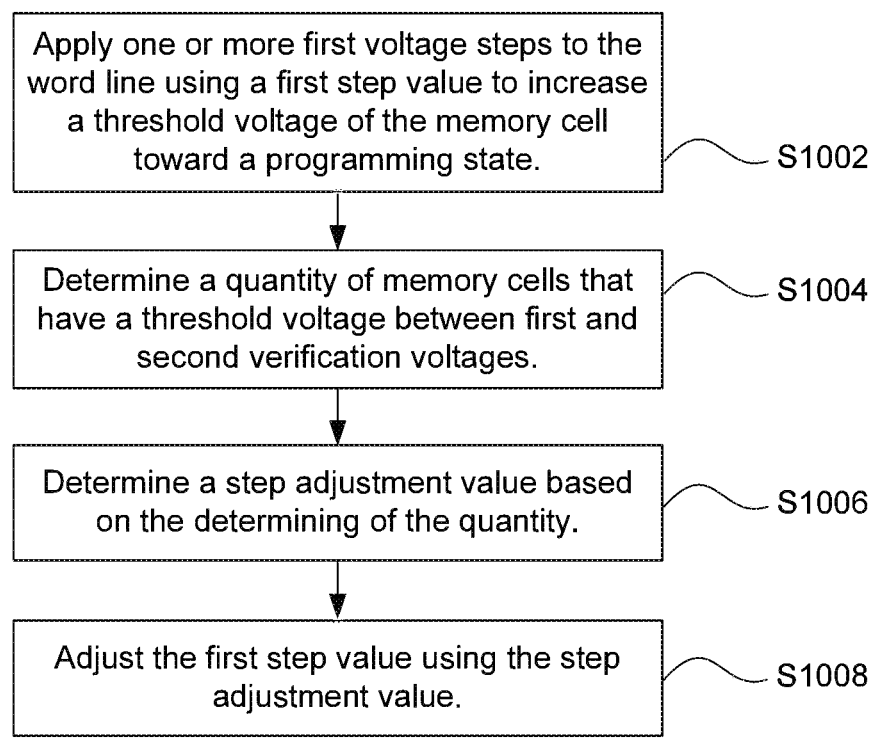
FIG. 10 illustrates a flowchart of method for programming a memory cell, according to some aspects.

FIG. 10 illustrates a method 1000 for programming a memory cell, according to some aspects. In some aspects, method 1000 can be used to program a memory device 100 comprising memory cells 340 and a word line 333 coupled to a memory cell configured to store two or more bits of data (FIGS. 1, 3A, 3B, 4). The method can comprise performing a programming operation on the memory cell using incremental step pulse programming (ISPP) as described above. At step S1002, one or more first voltage steps 702 (FIG. 7) can be applied to the word line using a first step value β to increase a programming state of the memory cell toward a programming state (e.g., CPA, CPB, CPC, CPD, or the like).

In some aspects, at step S1004, a quantity X of memory cells that have a threshold voltage between first and second verification voltages $V_{vA1}$ and $V_{vA2}$ can be determined. The first verification voltage $V_{vA1}$ can be within a range of threshold voltages corresponding to the programming state (e.g., within the bell curve distribution of CPA in FIG. 7). The second verification voltage $V_{vA2}$ can be less than and can be outside of the range of threshold voltages corresponding to the programming state.

In some aspects, at step S1006, a step adjustment value δ can be determined based on the determining of the quantity X.

In some aspects, at step S1008, the first step value β can be adjusted using the step adjustment value δ.

The method steps in aspects disclosed herein can be performed in any conceivable order and it is not required that all steps be performed. Moreover, the method steps of FIG. 10 described above merely reflect a non-limiting example of steps based on the contents of the present disclosure. That is, further method steps are envisaged based on the devices and functions described above in reference to FIGS. 1-9.

In summary, the present disclosure provides a method for mitigating over-programming during a programming operation. The programming method can be used for programming a memory device comprising memory cells and a word line coupled to a memory cell configured to store two or more bits of data. The programming method can include performing a programming operation on the memory cell using incremental step pulse programming (ISPP). For example, the programming method can include applying one or more first voltage steps to the word line using a first step value to increase a threshold voltage of the memory cell toward a programming state. The programming method can also include determining a quantity of memory cells that have a threshold voltage between first and second verification voltages. The first verification voltage can be within a range of threshold voltages corresponding to the programming state. The second verification voltage can be less than and can be outside of the range. The programming method can also include determining a step adjustment value based on the determining of the quantity. The programming method can also include adjusting the first step value using the step adjustment value so as to mitigate over-programming.

The present disclosure also provides a memory device capable of mitigating over-programming during a programming operation. The memory device can include an array of memory cells, a word line coupled to the memory cell, a peripheral circuit coupled to the word line, and a non-transitory computer-readable device. The memory cell can be configured to store two or more bits of data. The non-transitory computer-readable device can have instructions stored thereon that, when executed by a memory controller, cause the peripheral circuit to perform operations. The operations can include applying one or more first voltage steps to the word line using a first step value to increase a threshold voltage of the memory cell toward a programming state. The operations can also include determining a quantity of memory cells that have a threshold voltage between first and second verification voltages. The first verification voltage can be within a range of threshold voltages corresponding to the programming state. The second verification voltage can be less than and can be outside of the range. The operations can also include determining a step adjustment value based on the determining of the quantity. The operations can also include adjusting the first step value using the step adjustment value.

The present disclosure also provides a storage system capable of mitigating over-programming during a programming operation. The storage system can include one or more memory devices. At least one of the one or more memory devices can include can include an array of memory cells, a word line coupled to the memory cell, a peripheral circuit coupled to the word line, and a non-transitory computer-readable device. The memory cell can be configured to store two or more bits of data. The non-transitory computer-readable device can have instructions stored thereon that, when executed by a memory controller, cause the peripheral circuit to perform operations. The operations can include applying one or more first voltage steps to the word line using a first step value to increase a threshold voltage of the memory cell toward a programming state. The operations can also include determining a quantity of memory cells that have a threshold voltage between first and second verification voltages. The first verification voltage can be within a range of threshold voltages corresponding to the programming state. The second verification voltage can be less than and can be outside of the range. The operations can also include determining a step adjustment value based on the determining of the quantity. The operations can also include adjusting the first step value using the step adjustment value.

The present disclosure also provides a non-transitory computer readable device having executable instructions for mitigating over-programming during a programming operation. The non-transitory computer-readable device can have instructions stored thereon that, when executed by a memory controller of a memory device, cause the peripheral circuit to perform operations. The memory device can include a memory cell configured to store two or more bits of data, a word line coupled to the memory cell, and a peripheral circuit coupled to the word line. The operations can include applying one or more first voltage steps to the word line using a first step value to increase a threshold voltage of the memory cell toward a programming state. The operations can also include determining a quantity of memory cells that have a threshold voltage between first and second verification voltages. The first verification voltage can be within a range of threshold voltages corresponding to the programming state. The second verification voltage can be less than and can be outside of the range. The operations can also include determining a step adjustment value based on the determining of the quantity. The operations can also include adjusting the first step value using the step adjustment value.

The present disclosure also provides a memory device capable of mitigating over-programming during a programming operation. The memory device can include an array of memory cells, a word line coupled to the memory cell, and a peripheral circuit coupled to the word line. The memory cell can be configured to store two or more bits of data. The peripheral circuit can be configured to apply one or more first voltage steps to the word line using a first step value to increase a threshold voltage of the memory cell toward a programming state. The peripheral circuit can also be configured to determine a quantity of memory cells that have a threshold voltage between first and second verification voltages. The first verification voltage can be within a range of threshold voltages corresponding to the programming state. The second verification voltage can be less than and can be outside of the range. The peripheral circuit can also be configured to determine a step adjustment value based on the determining of the quantity. The peripheral circuit can be configured to adjust the first step value using the step adjustment value.

The foregoing description of the specific aspects will so fully reveal the general nature of the present disclosure that others can, by applying knowledge within the skill of the art, readily modify and/or adapt, for various applications, such specific aspects, without undue experimentation, and without departing from the general concept of the present disclosure. Therefore, such adaptations and modifications are intended to be within the meaning and range of equivalents of the disclosed aspects, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Aspects of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary aspects of the present disclosure as contemplated by the inventor(s), and thus, are not intended to limit the present disclosure and the appended claims in any way.

The breadth and scope of the present disclosure should not be limited by any of the above-described exemplary aspects, but should be defined only in accordance with the following claims and their equivalents.

What is claimed is:

1. A method for programming a memory device comprising memory cells and a word line coupled to a memory cell, the method comprising:
   performing a programming operation on the memory cell using incremental step pulse programming (ISPP), comprising:
   applying one or more first voltage steps to the word line using a first step value to increase a threshold voltage of the memory cell toward a programming state;
   determining a quantity of memory cells that have a threshold voltage between first and second verification voltages, wherein the second verification voltage is less than the first verification voltage and outside of a range of threshold voltages corresponding to the programming state;
   determining a step adjustment value based on the determining of the quantity; and
   adjusting the first step value using the step adjustment value.

2. The programming method of claim 1, further comprising:
   before the determining of the quantity of memory cells that have a threshold voltage between first and second verification voltages, determining a quantity of memory cells that have a threshold voltage that is greater than the second verification voltage.

3. The programming method of claim 2, wherein the determining of the quantity of memory cells that have a threshold voltage that is greater than the second verification voltage comprises:
   determining whether a number of memory cells that have a threshold voltage that is greater than the second verification voltage is one or greater.

4. The programming method of claim 1, wherein the determining of the quantity of memory cells that have a threshold voltage between first and second verification voltages comprises:
   determining a quantity of memory cells that have a threshold voltage that is equal to or greater than the first verification voltage; and
   determining a quantity of memory cells that have a threshold voltage that is equal to or greater than the second verification voltage.

5. The programming method of claim 1, wherein the determining of the quantity of memory cells that have a threshold voltage between first and second verification voltages further comprises:
   determining a proportion of memory cells that have a threshold voltage between first and second verification voltages with respect to a statistical distribution of threshold voltages associated with the programming state.

6. The programming method of claim 1, wherein the determining of the quantity of memory cells that have a threshold voltage between first and second verification voltages further comprises:
performing a dual-strobe sense operation with the first verification voltage being applied to the word line.

7. The programming method of claim 1, wherein:
the determining of the quantity of memory cells that have a threshold voltage between first and second verification voltages comprises:
determining whether the quantity is in a first range or second range;
a first step adjustment value corresponds to the first range and a second step adjustment value corresponds to the second range;
the determining of the step adjustment value based on the determining of the quantity comprises:
selecting the first or second step adjustment value based on the determining of whether the quantity is in the first range or second range.

8. The programming method of claim 7, wherein the first range is less than the second range, and the first step adjustment value is less than the second range.

9. The programming method of claim 1, wherein the performing of the programming operation further comprises:
applying a second voltage step to the word line based on the adjusting of the first step value to increase the threshold voltage of the memory cell.

10. The programming method of claim 9, wherein the applying of the second voltage step uses a second voltage step equal to a difference of the first step value and the step adjustment value.

11. A memory device comprising:
an array of memory cells;
a word line coupled to a memory cell in the array of memory cells; and
a peripheral circuit coupled to the array of memory cells through the word line and configured to perform operations comprising:
applying one or more first voltage steps to the word line using a first step value to increase a threshold voltage of the memory cell toward a programming state;
determining a quantity of memory cells that have a threshold voltage between first and second verification voltages, wherein the second verification voltage is less than the first verification voltage and outside of a range of threshold voltages corresponding to the programming state;
determining a step adjustment value based on the determining of the quantity; and
adjusting the first step value using the step adjustment value.

12. The memory device of claim 11, wherein the operations to further comprise:
before the determining of the quantity of memory cells that have a threshold voltage between first and second verification voltages, determining a quantity of memory cells that have a threshold voltage that is greater than the second verification voltage.

13. The memory device of claim 12, wherein the determining of the quantity of memory cells that have a threshold voltage that is greater than the second verification voltage comprises:
determining whether a number of memory cells that have a threshold voltage that is greater than the second verification voltage is one or greater.

14. The memory device of claim 11, wherein the determining of the quantity of memory cells that have a threshold voltage between first and second verification voltages comprises:
determining a quantity of memory cells that have a threshold voltage that is equal to or greater than the first verification voltage; and
determining a quantity of memory cells that have a threshold voltage that is equal to or greater than the second verification voltage.

15. The memory device of claim 11, wherein the determining of the quantity of memory cells that have a threshold voltage between first and second verification voltages comprises:
determining a proportion of memory cells that have a threshold voltage between first and second verification voltages with respect to a statistical distribution of threshold voltages associated with the programming state.

16. The memory device of claim 11, wherein the determining of the quantity of memory cells that have a threshold voltage between first and second verification voltages comprises:
performing a dual-strobe sense operation with the first verification voltage being applied to the word line.

17. The memory device of claim 11, wherein:
the determining of the quantity of memory cells that have a threshold voltage between first and second verification voltages comprises:
determining whether the quantity is in a first range or second range;
a first step adjustment value corresponds to the first range and a second step adjustment value corresponds to the second range;
the determining of the step adjustment value based on the determining of the quantity comprises:
selecting the first or second step adjustment value based on the determining of whether the quantity is in the first range or second range.

18. The memory device of claim 11, wherein the operations further comprise:
applying a second voltage step to the word line based on the adjusting of the first step value to increase the threshold voltage of the memory cell.

19. The memory device of claim 18, wherein the applying of the second voltage step uses a second voltage step equal to a difference of the first step value and the step adjustment value.

20. A storage system comprising:
one or more memory devices, wherein at least one of the one or more memory devices comprising:
an array of memory cells;
a word line coupled to a memory cell in the array of memory cells; and
a peripheral circuit coupled to the array of memory cells through the word line and configured to perform operations comprising:
applying one or more first voltage steps to the word line using a first step value to increase a threshold voltage of the memory cell toward a programming state;
determining a quantity of memory cells that have a threshold voltage between first and second verification voltages, wherein the second verification voltage is less than the first verification voltage and outside of a range of threshold voltages corresponding to the programming state;

determining a step adjustment value based on the determining of the quantity; and adjusting the first step value using the step adjustment value; and a memory controller coupled the one or more memory devices and configured to control the one or more memory devices.

* * * * *